United States Patent
He

(10) Patent No.: US 12,114,463 B2
(45) Date of Patent: Oct. 8, 2024

(54) ELECTRIC CABINET WITH HEAT DISSIPATION SYSTEM

(71) Applicant: HANGZHOU FULLSEMI SEMICONDUCTOR CO., LTD., Hangzhou (CN)

(72) Inventor: Jingyang He, Hangzhou (CN)

(73) Assignee: HANGZHOU FULLSEMI SEMICONDUCTOR CO., LTD., Zhejiang (CN)

( * ) Notice: Subject to any disclaimer, the term of this patent is extended or adjusted under 35 U.S.C. 154(b) by 174 days.

(21) Appl. No.: 17/966,738

(22) Filed: Oct. 14, 2022

(65) Prior Publication Data

US 2023/0180425 A1 Jun. 8, 2023

(30) Foreign Application Priority Data

Dec. 3, 2021 (CN) .......................... 202111467205.7

(51) Int. Cl.
*H05K 7/20* (2006.01)
(52) U.S. Cl.
CPC ..... *H05K 7/20172* (2013.01); *H05K 7/20263* (2013.01); *H05K 7/20272* (2013.01)
(58) Field of Classification Search
CPC .... F24F 13/30; F24F 1/0011; H05K 7/20609; H05K 7/20009; H05K 7/20781; H05K 7/20736; H05K 7/20572; H05K 7/20818; H05K 7/20172; H05K 7/20263; H05K 7/20272; H02B 1/30; H02B 1/56; H02B 1/565; H02B 1/015
See application file for complete search history.

(56) References Cited

U.S. PATENT DOCUMENTS

| | | | | |
|---|---|---|---|---|
| 7,751,188 | B1* | 7/2010 | French | H05K 7/20736 361/691 |
| 10,037,061 | B1* | 7/2018 | Panchapakesan | H05K 7/20836 |
| 2003/0050003 | A1* | 3/2003 | Charron | H05K 7/20745 454/186 |
| 2005/0168945 | A1* | 8/2005 | Coglitore | H05K 7/20736 415/178 |
| 2005/0237716 | A1* | 10/2005 | Chu | H05K 7/20736 361/696 |
| 2007/0019380 | A1* | 1/2007 | Campbell | H05K 7/20736 361/679.46 |
| 2009/0255653 | A1* | 10/2009 | Mills | H05K 7/20736 165/104.34 |
| 2010/0085707 | A1* | 4/2010 | Moss | H05K 7/20836 361/695 |

(Continued)

*Primary Examiner* — Michael A Matey

(57) ABSTRACT

An electric cabinet with a heat dissipation system is provided. The electric cabinet includes an body and a plurality of electric boards amounted in rows and arranged vertically in the body. The heat dissipation system includes: an air inlet and an air outlet respectively located on a lower surface and a higher surface of the body; a fan having fan blades arranged horizontally amounted between two of the electric boards for guiding the air to flow from the air inlet to the air outlet; and a plurality of air-cooling devices, each is amounted on sides of the body and designated with cooling one of the electric boards, wherein at least one of the air-cooling devices is amounted to be higher than the horizontal blades of the fan.

9 Claims, 2 Drawing Sheets

(56) References Cited

U.S. PATENT DOCUMENTS

| | | | | |
|---|---|---|---|---|
| 2012/0026691 A1* | 2/2012 | Campbell | .......... | H05K 7/20781 |
| | | | | 361/700 |
| 2013/0050923 A1* | 2/2013 | Wei | .................... | H05K 7/20745 |
| | | | | 361/679.5 |
| 2015/0162651 A1* | 6/2015 | Nakahama | ........ | H01M 10/6562 |
| | | | | 429/120 |
| 2016/0113157 A1* | 4/2016 | Bao | ........................ | A47B 81/00 |
| | | | | 312/198 |
| 2016/0324032 A1* | 11/2016 | Davis | .................... | G11B 33/142 |
| 2017/0013746 A1* | 1/2017 | Campbell | .......... | H05K 7/20736 |
| 2017/0027083 A1* | 1/2017 | Bai | .................... | H05K 7/20672 |
| 2017/0086324 A1* | 3/2017 | Papakos | .................... | H05K 7/14 |
| 2023/0022058 A1* | 1/2023 | Geng | .................... | H05K 3/0014 |

\* cited by examiner

ELECTRIC CABINET WITH HEAT DISSIPATION SYSTEM

FIELD OF INVENTION

The present disclosure relates to heat dissipation of electric cabinets, and more particularly, to an electric cabinet with a highly-efficient heat dissipation system.

BACKGROUND

Existing electric cabinets, such as a Wafer Stage Remote Cabinet (WSRC), are usually provided with multilayered electric boards. Operations such as calculations and controls are performed using electronic components amounted on the electric boards. When an electronic component operates for a long time, heat may be generated. If the heat in the electric cabinet cannot be properly dissipated, operations of the electric boards and electronic components thereon will be affected. FIG. 3 shows a heat dissipation system in an existing electric cabinet, wherein a horizontal heat dissipation fan 50 is provided on a body of the electric cabinet, an air inlet 52 is disposed on a bottom surface of the electric cabinet, and an air outlet 54 is disposed on a top surface of the electric cabinet, so that when the heat dissipation fan 50 is operating, cool ambient air outside the electric cabinet will enter the electric cabinet through the air inlet 52, and as the air flows upward and passes the electric boards amounted in the electric cabinet, heat exchanged and dissipation will be achieved. The reheated air is then discharged from the exhaust port 54, so that the temperature in the electric cabinet can be kept at a controlled level, thus preventing overheating the electric boards and electronic components in the electric cabinet and thermal damage due to lengthy operations.

However, in the heat dissipation system of the existing electric cabinet, because of the fact that the air inlet 52 is located on the bottom surface of the electric cabinet and the air outlet 54 is located on the top surface of the electric cabinet, the temperature of the cool ambient air entering from the bottom inlet of the electric cabinet will continuously rise after exchanging heat with electric boards located at lower levels of the electric cabinet, hindering heat dissipation for electric boards located at upper levels of the electric cabinet. As a result, heat concentrates at top and harms the electric boards located at the upper levels, which leads to premature aging of the electric boards.

SUMMARY

The present disclosure provides an electric cabinet with a heat dissipation system, wherein the electric cabinet comprises an body and multiple electric boards arranged in horizontal rows and along a vertical direction in the body, wherein the heat dissipation system comprises: an air inlet disposed on a bottom surface of the body, and an air outlet disposed on a top surface of the body; a fan with horizontally arranged fan blades amounted in the body at a position aligned to between two electric boards of the multiple electric boards for guiding air to flow from the air inlet to the air outlet; and multiple sets of air-cooling devices, disposed on sides of the body, wherein each set of the multiple sets of air-cooling devices is associated with one of the electric boards, and wherein at least one set of air-cooling devices is amounted higher than the fan with horizontally arranged fan blades.

In an embodiment, at least three of the air-cooling devices are amounted on one side of the body.

In an embodiment, the air-cooling devices are fans.

In an embodiment, more than one air inlets are arranged to be on the bottom surface of the body, and more than one air outlets are arranged to be on the top surface of the body.

In an embodiment, the body is provided with a heat-exchange cooling system, which cools air for the electric cabinet.

In an embodiment, the heat-exchange cooling system comprises a pump and a plurality of heat dissipation pipes connected to the pump, wherein the plurality of heat dissipation pipes is amounted above the air-cooling devices and installed with coolant.

In an embodiment, the plurality of heat dissipation pipe is amounted higher than horizontal blades of the fan.

In an embodiment, the plurality of heat dissipation pipes is amounted respectively in an one-to-one correspondence to the multiple sets of air-cooling devices, and wherein each of the plurality heat dissipation pipes is respectively amounted above the corresponding set of air-cooling devices.

In an embodiment, the body is provided with a heat-exchange cooling system which cools air generated by the electric boards, and wherein the plurality of heat dissipation pipes is connected to a pump and respectively installed with coolant.

DETAILED DESCRIPTION

Figure 1:
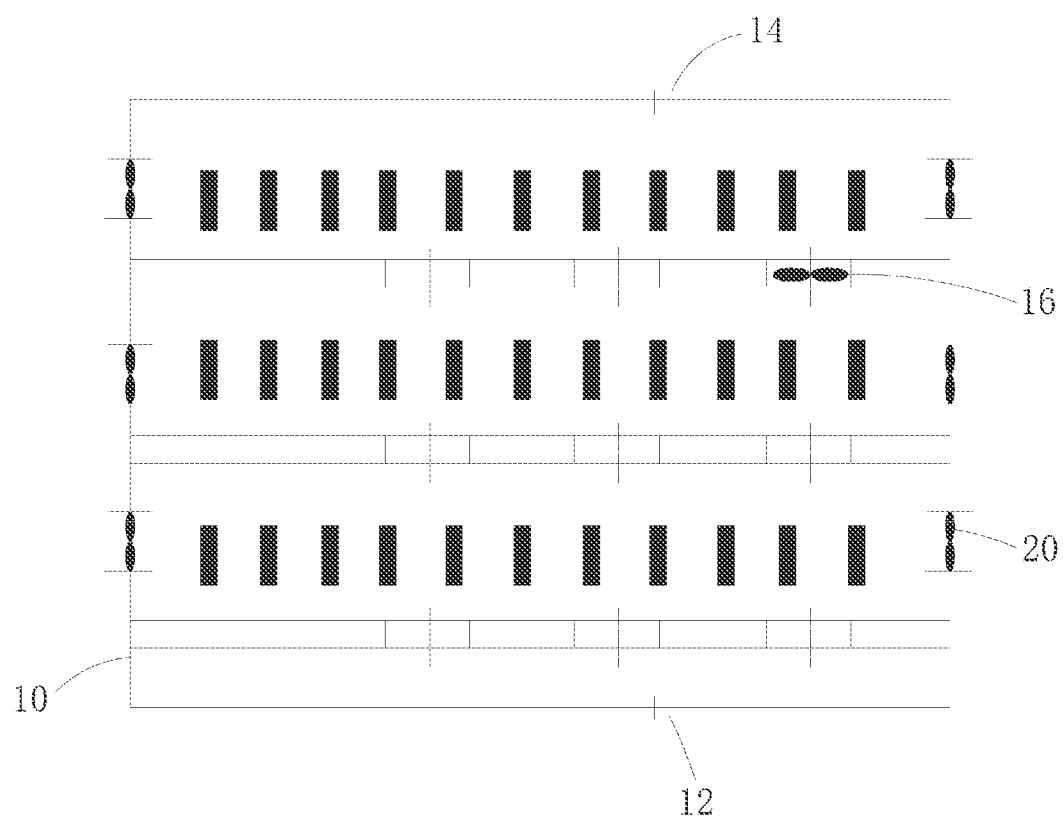
FIG. 1 is a diagram illustrating an exemplary structure of an electric cabinet according to an embodiment of the present disclosure.

The following specific examples illustrate embodiments of the present disclosure, and those skilled in the art can easily understand other advantages and efficiency of the present application from the present disclosure. The invention can also be implemented or applied by other different specific embodiments, and the details in this application can be modified or changed based on different viewpoints and applications without departing from the spirit of the invention. When the embodiment of the present disclosure is described in details, for better understanding, cross-sectional view showing the structures are not necessarily to scale. In addition, the schematic diagrams are only examples, and do not limit the scope of the present disclosure.

For the convenience of description, spatial relation terms such as "below", "under", "beneath", "on", "above", "up", etc. may be used herein to describe the relationships between an element or feature and other elements or features. It will be understood that these spatial relationship terms are intended to encompass directions/orientations of the device in use or operation other than those depicted in the drawings. In addition, when a first layer is referred to as being "between" a second layer and a third layer, the first layer may be the only layer between the second and third layers, or there may more layers between the two layers.

In the context of this disclosure, the structure described with a first feature "on top" of a second feature may include embodiments where the first and second features are formed in direct contact, or it may include embodiments where additional features are formed between the first and second features such that the first and second features are not in direct contact.

It should be noted that the drawings provided in this disclosure only illustrate the basic concept of the present invention in a schematic way, so the drawings only show the components related to the present invention. The drawings are not necessarily drawn according to the number, shape and size of the components in actual implementation; during the actual implementation, the type, quantity and proportion of each component can be changed as needed, and the components' layout may also be more complicated.

As shown in FIG. 1, the present disclosure provides an electric cabinet with a heat dissipation system, the electric cabinet comprises a body 10 where multiple electric boards (the dark rectangular stripes in the figure) are arranged along a vertical direction, and electronic components disposed on the electric boards are for various operations. The body 10 is approximately in a cuboid shape and includes a top surface, a bottom surface, a front surface, a back surface and two side surfaces, and the body 10 is configured to take in external ambient air from the bottom and exhaust air out from the top. At least one air inlet 12 may be disposed on the bottom surface of the electric cabinet 10, and at least one air outlet 14 may be disposed on the top surface of the electric cabinet. Further, at least a fan 16 with one horizontally placed fan blades is disposed in the electric cabinet 10 in a position in the vicinity of an electric board at a middle point to guide air to flow from the air inlet to the air outlet. In addition, multiple sets of air-cooling devices 20 are amounted on sides of the electric cabinet 10 and positions of the air-cooling devices 20 are aligned to rows of the electric boards in the electric cabinet 10. The air-cooling devices 20 are used to generate cool air and send it to the nearby electric boards in the electric cabinet 10. Each air-cooling device 20 can be a fan or a refrigeration machinery of an air conditioner. As shown in FIG. 1, three air-cooling devices 20 are installed on each side of the electric cabinet 10, wherein the each air-cooling device 20 is aligned to the center line of a nearby row of the electric boards or slightly above the center line of the nearby row of electric boards, and at least one set of air-cooling devices 20 are positioned higher than the horizontal fan blades in fan 16.

Therefore, when the fan 16 with horizontal fan blades is operating, the cool ambient air around the electric cabinet will flow into the electric cabinet 10 through the air inlet 12 at the bottom of the electric cabinet 10, flow upward from the bottom of the electric cabinet 10 guided by the fan 16 with horizontal fan blades, then heat exchange with the multiple electric boards disposed in the electric cabinet 10 in sequence to reduce the temperature of the electric boards and electronic components thereon, and finally be exhausted through the air outlet 14 at the top of the electric cabinet 10. In addition, with the air-cooling devices 20 being disposed at the sides of the electric cabinet 10, the cool ambient air around the electric cabinet can be introduced into the body 10 from the sides, thus effectively improving the heat dissipation of every electric board. Meanwhile, because at least one set of air-cooling devices are positioned higher than the fan 16 with horizontal fan blades, these higher air-cooling devices 20 can prevent the hot air from concentrating on the upper layers of the body 10, prevent the electric boards on the upper layers of the body 10 and the electronic components thereof from aging and being damaged due to exposure to excessive heat, and maintain normal operations of the electric cabinet for a long time.

Figure 2:
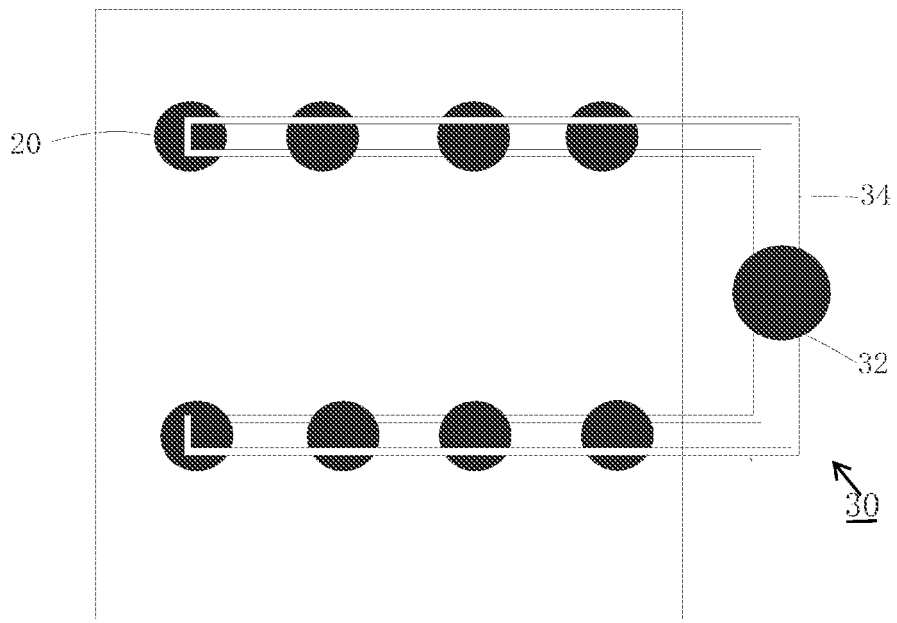
FIG. 2 is a diagram illustrating an exemplary structure of a heat-exchange cooling system according to an embodiment of the present disclosure.
Figure 3:
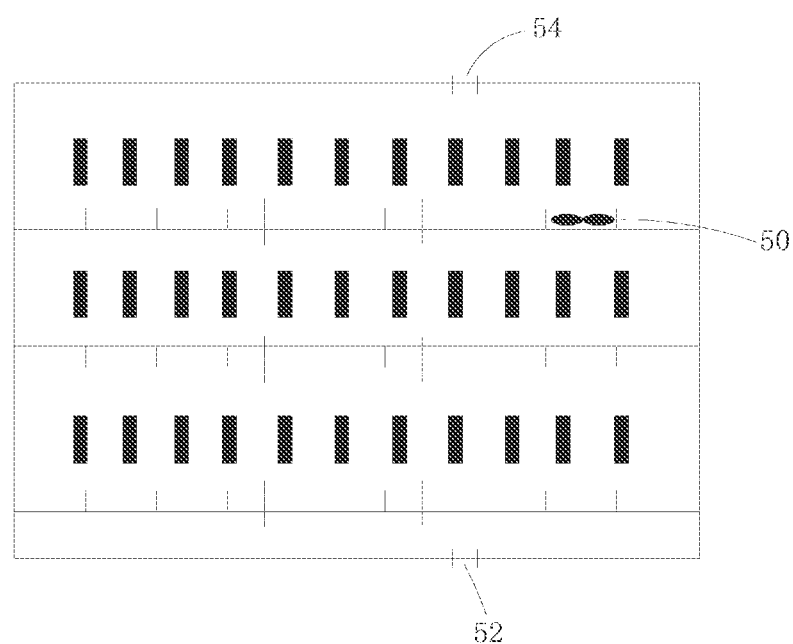
FIG. 3 is a diagram illustrating an exemplary structure of an existing electric cabinet.

In addition, as shown in FIG. 2, the body 10 of the electric cabinet can be further provided with a heat-exchange cooling system 30, which reduces the temperature of the cool air generated by the air-cooling devices 20. In an embodiment of the present disclosure, the heat-exchange cooling system 30 is smounted directly above the multiple sets of air-cooling devices 20, so that the temperature of the cool air discharged by the air-cooling devices 20 can be more easily lowered by the heat-exchange cooling system 30. Further, the heat-exchange cooling system 30 can also be arranged above the fan 16 with horizontal fan blades, in which case the heat-exchange cooling system 30 includes a pump 32, and a dissipation pipe 34 that is connected to the pump 32 and disposed above the corresponding air-cooling devices 20 and/or above the fan 16 with horizontal fan blades. The dissipation pipe 34 is provided with coolant that circulates along the dissipation pipe 34, wherein the coolant can be liquid with cooling effect such as silicone oil. With the help of the heat-exchange cooling system 30, the temperature of the air generated by the fan 16 with horizontal fan blades and each air-cooling device 20 can be effectively reduced. In addition, with the heat exchange through air circulation between the fan 16 with horizontal fan blades and the air-cooling devices 20, the temperature inside the electric cabinet 10 can be effectively reduced, achieving efficient heat dissipation.

Furthermore, in one embodiment of the present disclosure, one heat-dissipation pipe 34 can be provided for each set of air-cooling devices 20. For example, when three air-cooling devices 20 are provided on both sides of the electric cabinet 10, three heat-dissipation pipes 34 can be provided correspondingly, and each heat-dissipation pipe 34 is connected to a pump 32 after passing over the corresponding air-cooling devices 20 or the fan 16 with horizontal fan blades, so that the temperature of air generated by all the air-cooling devices 20 and the fan 16 with horizontal fan blades can be reduced, thus effectively reducing the overall temperature of the electric cabinet 10.

The above examples only illustrate the main principles and performance of the present disclosure, and are not meant to limit the scope of the present disclosure. Any skilled in the art can modify or change the above embodiments without departing from the spirit and scope of the present disclosure. Therefore, all equivalent modifications or changes made by those skilled in the art without departing from the spirit and technical concepts disclosed by the present disclosure shall fall within the claimed scope of the present disclosure.

What is claimed is:

1. An electric cabinet with a heat dissipation system, wherein the electric cabinet comprises a body and multiple electric boards arranged in horizontal rows and along a vertical direction in the body, wherein the heat dissipation system comprises:
an air inlet disposed on a bottom surface of the body, and an air outlet disposed on a top surface of the body;
a fan with horizontally arranged fan blades amounted in the body at a position aligned between two electric boards of the multiple electric boards for guiding air to flow from the air inlet to the air outlet; and
multiple sets of air-cooling devices, disposed on sides of the body, wherein each set of the multiple sets of air-cooling devices is associated with one of the electric boards, and wherein at least one set of air-cooling devices is amounted higher than the fan with horizontally arranged fan blades.

2. The electric cabinet with the heat dissipation system according to claim 1, wherein at least three of the air-cooling devices are amounted on one side of the body.

3. The electric cabinet with the heat dissipation system according to claim 1, wherein the multiple sets of air-cooling devices are fans.

4. The electric cabinet with the heat dissipation system according to claim 1, wherein more than one air inlets are arranged to be on the bottom surface of the body, and more than one air outlets are arranged to be on the top surface of the body.

5. The electric cabinet with the heat dissipation system according to claim 1, wherein the body is provided with a heat-exchange cooling system, which cools air for the electric cabinet.

6. The electric cabinet with the heat dissipation system according to claim 5, wherein the heat-exchange cooling system comprises a pump and a plurality of heat dissipation pipes connected to the pump, wherein the plurality of heat dissipation pipes is amounted above the air-cooling devices and installed with coolant.

7. The electric cabinet with the heat dissipation system according to claim 6, wherein the plurality of heat dissipation pipes is amounted higher than the horizontal blades of the fan.

8. The electric cabinet with the heat dissipation system according to claim 1, wherein the plurality of heat dissipation pipes is amounted respectively in an one-to-one correspondence to the multiple sets of air-cooling devices, and wherein each of plurality the heat dissipation pipes is respectively amounted above the corresponding set of air-cooling devices.

9. The electric cabinet with the heat dissipation system according to claim 8, wherein the body is provided with a heat-exchange cooling system which cools air generated by the electric boards, and wherein the plurality of heat dissipation pipes is connected to a pump and respectively installed with coolant.

\* \* \* \* \*